United States Patent
Makansi et al.

(10) Patent No.: US 9,638,442 B2
(45) Date of Patent: May 2, 2017

(54) MEDICAL, TOPPER, PET WIRELESS, AND AUTOMATED MANUFACTURING OF DISTRIBUTED THERMOELECTRIC HEATING AND COOLING

(71) Applicant: TEMPRONICS, INC., Tucson, AZ (US)

(72) Inventors: Tarek Makansi, Tucson, AZ (US);
Steven Wood, Tucson, AZ (US);
Michael J. Berman, Tucson, AZ (US);
Mark Nelsen Evers, Tucson, AZ (US);
John L. Franklin, Tucson, AZ (US);
Steve Thomson, Tucson, AZ (US)

(73) Assignee: TEMPRONICS, INC., Tucson, AZ (US)

(*) Notice: Subject to any disclaimer, the term of this patent is extended or adjusted under 35 U.S.C. 154(b) by 237 days.

(21) Appl. No.: 13/940,093

(22) Filed: Jul. 11, 2013

(65) Prior Publication Data
US 2014/0041396 A1  Feb. 13, 2014

Related U.S. Application Data

(60) Provisional application No. 61/680,405, filed on Aug. 7, 2012, provisional application No. 61/716,671, filed on Oct. 22, 2012.

(51) Int. Cl.
*F25B 21/02* (2006.01)
*F25B 21/04* (2006.01)
(Continued)

(52) U.S. Cl.
CPC .............. *F25B 21/04* (2013.01); *A61G 7/057* (2013.01); *A61G 7/05784* (2016.11);
(Continued)

(58) Field of Classification Search
CPC ............................ F25B 21/02; B60H 1/00478
(Continued)

(56) References Cited

U.S. PATENT DOCUMENTS

| 2,376,902 A | 5/1945 | Clark |
| RE22,763 E | 6/1946 | Clark |

(Continued)

FOREIGN PATENT DOCUMENTS

| DE | 4010909 | 10/1991 | ............. H01J 21/04 |
| EP | 1612492 | 1/2006 | ............. F25B 21/00 |

(Continued)

OTHER PUBLICATIONS

International Search Report and Written Opinion issued in related application No. PCT/US2013/050378, dated Dec. 30, 2013 (8 pgs).
(Continued)

*Primary Examiner* — Melvin Jones
(74) *Attorney, Agent, or Firm* — Wilson Sonsini Goodrich & Rosati

(57) ABSTRACT

A thermoelectric device comprising an elongated panel, formed of a thermally insulating material, and having a plurality of thermoelectric elements comprising compacted conductors inside the insulating material and expanded conductors outside the insulating material is combined with other layers for leakage current interception, bodily fluid absorption, and pillars that preserve pressure re-distribution. The thermoelectric device may be integrated into a variety of surfaces or enclosures needing heating or cooling and manufactured using pre-existing automated equipment.

27 Claims, 10 Drawing Sheets

(51) Int. Cl.
  *B23P 15/26*  (2006.01)
  *A61G 7/057*  (2006.01)
  *H01L 35/00*  (2006.01)

(52) U.S. Cl.
  CPC .............. *B23P 15/26* (2013.01); *H01L 35/00* (2013.01); *Y10T 29/49002* (2015.01)

(58) Field of Classification Search
  USPC ..... 62/3.2, 3.3, 3.5, 3.6, 3.61, 3.7; 29/592.1; 5/468, 469
  See application file for complete search history.

(56) References Cited

U.S. PATENT DOCUMENTS

| | | | |
|---|---|---|---|
| 2,606,996 A | 8/1952 | Westerberg et al. | |
| 2,796,532 A | 6/1957 | Teague et al. | 250/213 |
| 2,858,350 A | 10/1958 | Fritts et al. | 136/4 |
| 3,083,381 A | 4/1963 | Bailey | |
| 3,129,345 A | 4/1964 | Hatsopoulos et al. | 310/306 |
| 3,136,577 A | 6/1964 | Richard | |
| 3,173,032 A | 3/1965 | Maynard | 310/306 |
| 3,196,524 A | 7/1965 | Jamison | 29/155.5 |
| 3,217,189 A | 11/1965 | Bloss | 310/306 |
| 3,225,549 A | 12/1965 | Elfving | 62/3 |
| 3,406,753 A * | 10/1968 | Habdas | 165/185 |
| 3,549,201 A | 12/1970 | Earl | |
| 3,627,988 A | 12/1971 | Romaniec | 219/529 |
| 3,754,703 A | 8/1973 | Saponara | 236/15 A |
| 4,343,993 A | 8/1982 | Binnig et al. | 250/306 |
| 4,423,308 A | 12/1983 | Callaway et al. | |
| 4,523,594 A | 6/1985 | Kuznetz | |
| 4,625,394 A | 12/1986 | Kemnitz et al. | 29/611 |
| 4,820,903 A | 4/1989 | Ishida | 219/213 |
| 4,825,488 A | 5/1989 | Bedford | 5/469 |
| 4,825,868 A | 5/1989 | Susa et al. | 128/376 |
| 4,930,317 A * | 6/1990 | Klein | 62/3.3 |
| 4,937,435 A | 6/1990 | Gross et al. | |
| 4,969,684 A | 11/1990 | Zarotti | |
| 5,028,835 A | 7/1991 | Fitzpatrick | 313/14 |
| 5,138,851 A | 8/1992 | Mardikian | |
| 5,541,464 A | 7/1996 | Johnson et al. | 310/306 |
| 5,594,534 A | 1/1997 | Genovese | 399/285 |
| 5,653,741 A | 8/1997 | Grant | |
| 5,712,448 A | 1/1998 | Vandersande et al. | |
| 5,837,002 A | 11/1998 | Augustine et al. | |
| 5,851,338 A | 12/1998 | Pushaw | |
| 5,892,656 A | 4/1999 | Bass | 361/699 |
| 5,917,229 A | 6/1999 | Nathan et al. | |
| 6,064,137 A | 5/2000 | Cox | 310/306 |
| 6,129,990 A | 10/2000 | Frater | 428/607 |
| 6,220,659 B1 | 4/2001 | McDowell et al. | |
| 6,223,539 B1 | 5/2001 | Bell | |
| 6,230,501 B1 | 5/2001 | Bailey, Sr. et al. | |
| 6,323,413 B1 | 11/2001 | Roth et al. | 136/201 |
| 6,323,777 B1 | 11/2001 | Durston et al. | 340/679 |
| 6,328,594 B1 | 12/2001 | Mullen, Jr. | |
| 6,385,976 B1 | 5/2002 | Yamamura et al. | 62/3.7 |
| 6,410,971 B1 | 6/2002 | Otey | 257/467 |
| 6,494,048 B1 | 12/2002 | Ghoshal et al. | 62/3.7 |
| 6,501,055 B2 | 12/2002 | Rock et al. | 219/545 |
| 6,523,354 B1 | 2/2003 | Tolbert | |
| 6,582,456 B1 | 6/2003 | Hand et al. | 607/108 |
| 6,639,242 B1 | 10/2003 | Chen et al. | 257/19 |
| 6,651,760 B2 | 11/2003 | Cox et al. | 180/65.3 |
| 6,653,607 B2 * | 11/2003 | Ellis et al. | 219/528 |
| 6,720,704 B1 | 4/2004 | Tavkhelidze et al. | 310/306 |
| 6,774,003 B2 | 8/2004 | Tavkhelidze et al. | 310/306 |
| 6,823,678 B1 | 11/2004 | Li | |
| 6,863,981 B2 | 3/2005 | McBain | 428/412 |
| 6,876,123 B2 | 4/2005 | Martinovsky et al. | 310/306 |
| 6,884,732 B2 | 4/2005 | Najafi et al. | 438/713 |
| 6,946,596 B2 | 9/2005 | Kucherov et al. | 136/205 |
| 7,005,381 B1 | 2/2006 | Cox | 438/689 |
| 7,117,687 B2 | 10/2006 | Naaman | |
| 7,140,102 B2 | 11/2006 | Taliashvili et al. | 29/842 |
| 7,152,412 B2 | 12/2006 | Harvie | |
| 7,253,549 B2 | 8/2007 | Tavkhelidze et al. | 310/306 |
| 7,305,839 B2 | 12/2007 | Weaver, Jr. | 62/132 |
| 7,456,543 B2 | 11/2008 | Makansi | 310/306 |
| 7,708,338 B2 | 5/2010 | Wolas | |
| 7,996,936 B2 * | 8/2011 | Marquette et al. | 5/423 |
| 8,018,117 B2 | 9/2011 | Makansi | |
| 8,066,324 B2 | 11/2011 | Nathan et al. | |
| 8,101,847 B2 * | 1/2012 | Okamura | 136/200 |
| 8,102,096 B2 | 1/2012 | Makansi | |
| 8,327,477 B2 * | 12/2012 | Lachenbruch et al. | 5/421 |
| 8,495,974 B2 | 7/2013 | Agosta | |
| 8,969,703 B2 | 3/2015 | Makansi et al. | |
| 9,066,601 B1 | 6/2015 | Aminy et al. | |
| 9,272,647 B2 | 3/2016 | Gawade et al. | |
| 9,408,475 B2 | 8/2016 | Mikkelsen et al. | |
| 2001/0011601 A1 | 8/2001 | Renaud | |
| 2001/0046749 A1 | 11/2001 | Tavkhelidze et al. | 438/380 |
| 2002/0046762 A1 | 4/2002 | Rossi | 136/201 |
| 2002/0058975 A1 | 5/2002 | Bieberich | |
| 2002/0170172 A1 | 11/2002 | Tavkhelidze et al. | 29/842 |
| 2003/0042819 A1 | 3/2003 | Martinovsky et al. | 310/306 |
| 2003/0084935 A1 | 5/2003 | Bell | |
| 2003/0131419 A1 | 7/2003 | Vansteenburg | |
| 2003/0141455 A1 | 7/2003 | Lambert et al. | 250/353 |
| 2003/0154725 A1 * | 8/2003 | McGrew | 62/3.7 |
| 2003/0184188 A1 | 10/2003 | Kucherov et al. | 310/306 |
| 2003/0230913 A1 | 12/2003 | Buss et al. | |
| 2004/0009729 A1 | 1/2004 | Hill et al. | |
| 2004/0050415 A1 | 3/2004 | Kucherov et al. | 136/252 |
| 2004/0100131 A1 | 5/2004 | Howick et al. | |
| 2004/0160092 A1 | 8/2004 | Laib | |
| 2004/0195934 A1 | 10/2004 | Tanielian | 310/306 |
| 2005/0050415 A1 | 3/2005 | Anand et al. | 714/726 |
| 2005/0066505 A1 | 3/2005 | Iqbal et al. | |
| 2005/0077618 A1 | 4/2005 | McCutcheon et al. | |
| 2005/0140189 A1 | 6/2005 | Bajic et al. | |
| 2005/0184565 A1 | 8/2005 | Weiss et al. | |
| 2005/0184603 A1 | 8/2005 | Martsinovsky | 310/49 |
| 2005/0189871 A1 | 9/2005 | Tavkhelidze et al. | 313/498 |
| 2005/0253425 A1 | 11/2005 | Asada et al. | |
| 2006/0000226 A1 | 1/2006 | Weaver, Jr. | 62/132 |
| 2006/0027552 A1 | 2/2006 | Krobok et al. | |
| 2006/0038290 A1 | 2/2006 | Tavkhelidze et al. | 257/734 |
| 2006/0068176 A1 | 3/2006 | Zafiroglu et al. | |
| 2006/0110657 A1 | 5/2006 | Stanton et al. | |
| 2006/0138896 A1 | 6/2006 | Makansi | 310/306 |
| 2006/0162761 A1 | 7/2006 | Tanielian | 136/205 |
| 2006/0180829 A1 | 8/2006 | Martsinovsky | 257/104 |
| 2006/0191886 A1 | 8/2006 | Pak | |
| 2006/0192196 A1 | 8/2006 | Tavkhelidze et al. | 257/30 |
| 2006/0207643 A1 | 9/2006 | Weaver, Jr. | 136/205 |
| 2007/0001507 A1 | 1/2007 | Brennan et al. | |
| 2007/0023077 A1 | 2/2007 | Tanielian | 136/201 |
| 2007/0033782 A1 | 2/2007 | Taliashvili et al. | 29/25.02 |
| 2007/0056623 A1 | 3/2007 | Tavkhelidze et al. | 136/205 |
| 2007/0069357 A1 | 3/2007 | Weaver et al. | 257/686 |
| 2007/0084220 A1 | 4/2007 | Asada et al. | |
| 2007/0112390 A1 | 5/2007 | Lau et al. | 607/37 |
| 2007/0137687 A1 | 6/2007 | Tanielian | 136/205 |
| 2007/0181913 A1 | 8/2007 | Li | 257/213 |
| 2007/0272673 A1 | 11/2007 | Keane | |
| 2007/0277313 A1 | 12/2007 | Terech et al. | |
| 2007/0289620 A1 | 12/2007 | Stark | |
| 2007/0295973 A1 | 12/2007 | Jinbo et al. | 257/88 |
| 2008/0017237 A1 | 1/2008 | Bray et al. | 136/224 |
| 2008/0029146 A1 | 2/2008 | Plissonnier et al. | 136/242 |
| 2008/0042163 A1 | 2/2008 | Weaver, Jr. | 257/108 |
| 2008/0054490 A1 | 3/2008 | McLellan et al. | |
| 2008/0155981 A1 | 7/2008 | Tanielian | 60/527 |
| 2008/0173022 A1 | 7/2008 | Petrovski | 62/3.2 |
| 2008/0237827 A1 | 10/2008 | Autry | 257/688 |
| 2009/0025774 A1 | 1/2009 | Plissonnier et al. | 136/224 |
| 2009/0038317 A1 | 2/2009 | Otey | |
| 2009/0078690 A1 | 3/2009 | Lee et al. | |
| 2009/0121524 A1 | 5/2009 | Abe et al. | |
| 2009/0199571 A1 * | 8/2009 | Creech et al. | 62/3.2 |
| 2009/0200983 A1 | 8/2009 | Dyer et al. | 320/107 |

(56) References Cited

U.S. PATENT DOCUMENTS

| | | | |
|---|---|---|---|
| 2009/0205695 A1 | 8/2009 | Makansi | 136/201 |
| 2009/0229648 A1 | 9/2009 | Makansi | 136/201 |
| 2009/0257774 A1 | 10/2009 | Rummler et al. | |
| 2009/0283124 A1 | 11/2009 | Seo | |
| 2009/0322221 A1 | 12/2009 | Makansi | 313/523 |
| 2010/0031448 A1 | 2/2010 | Hijlkema | |
| 2010/0101620 A1 | 4/2010 | Tanaka | 136/205 |
| 2010/0107657 A1 | 5/2010 | Vistakula | 62/3.5 |
| 2010/0269517 A1 | 10/2010 | Ikeda et al. | 62/3.7 |
| 2010/0270996 A1 | 10/2010 | Ramadas et al. | 323/311 |
| 2010/0281884 A1 | 11/2010 | Rawski et al. | |
| 2010/0288370 A1 | 11/2010 | Volden et al. | |
| 2010/0327636 A1 | 12/2010 | Stoll et al. | |
| 2011/0016886 A1 | 1/2011 | Ghoshal et al. | 62/3.2 |
| 2011/0109128 A1 | 5/2011 | Axakov et al. | |
| 2011/0139203 A1 | 6/2011 | Yap | 136/205 |
| 2011/0226299 A1 | 9/2011 | Makansi | |
| 2012/0019074 A1 | 1/2012 | Frolov et al. | 307/82 |
| 2012/0032478 A1 | 2/2012 | Friderich et al. | |
| 2012/0060882 A1 | 3/2012 | Makansi | |
| 2012/0060885 A1 | 3/2012 | Makansi et al. | 136/206 |
| 2012/0110734 A1 | 5/2012 | An | 5/423 |
| 2012/0113594 A1 | 5/2012 | Goettert et al. | 361/699 |
| 2012/0131748 A1 | 5/2012 | Brykalski et al. | |
| 2012/0146455 A1 | 6/2012 | Makansi | |
| 2012/0148328 A1 | 6/2012 | Jollet | 401/2 |
| 2012/0198616 A1 | 8/2012 | Makansi et al. | |
| 2013/0008181 A1 | 1/2013 | Makansi et al. | |
| 2013/0014796 A1 | 1/2013 | Tajima | 136/203 |
| 2013/0097777 A1 | 4/2013 | Marquette et al. | |
| 2013/0106147 A1 | 5/2013 | Lazanja et al. | |
| 2013/0180563 A1 | 7/2013 | Makansi | |
| 2014/0082846 A1 | 3/2014 | Blazar | |
| 2014/0331688 A1* | 11/2014 | Kossakovski | H01M 10/425 62/3.3 |
| 2015/0121901 A1 | 5/2015 | Makansi et al. | |
| 2015/0219368 A1 | 8/2015 | Makansi et al. | |
| 2015/0266405 A1 | 9/2015 | Fitzpatrick et al. | |
| 2016/0133817 A1 | 5/2016 | Makansi et al. | |

FOREIGN PATENT DOCUMENTS

| | | | |
|---|---|---|---|
| GB | 2065465 | 7/1981 | A47C 31/00 |
| JP | S6147907 A | 3/1986 | |
| JP | H02116613 U | 9/1990 | |
| JP | 2003042590 A | 2/2003 | |
| JP | 2003209297 | 7/2003 | H01L 35/32 |
| JP | 2007175476 A | 7/2007 | |
| JP | 2008538850 A | 11/2008 | |
| JP | 2009074746 A | 4/2009 | |
| JP | 2013198730 A | 10/2013 | |
| WO | WO-9811397 A1 | 3/1998 | |
| WO | WO9913562 | 3/1999 | H02N 2/00 |
| WO | WO2007078048 | 7/2007 | A45D 1/04 |
| WO | WO2008027928 | 3/2008 | H01J 1/02 |
| WO | WO2009102706 | 8/2009 | H01L 35/34 |
| WO | WO2010078521 | 7/2010 | H01L 35/34 |
| WO | WO-2010108254 A1 | 9/2010 | |
| WO | WO2010150162 | 12/2010 | A45D 2/48 |
| WO | WO-2012037031 A1 | 3/2012 | |
| WO | WO-2014052145 A1 | 4/2014 | |
| WO | WO-2015066518 A1 | 5/2015 | |

OTHER PUBLICATIONS

International Preliminary Report on Patentability issued in related application No. PCT/US2012/045443, dated Jan. 16, 2014 (6 pgs).
Office Action issued in related U.S. Appl. No. 13/101,015, dated Mar. 21, 2014 (24 pgs).
Mexican Office Action issued in related application No. MX/a/2013/009378, dated Mar. 27, 2014 (2 pgs).
Notice of Allowance issued in related U.S. Appl. No. 13/101,015, dated Jul. 24, 2014 (23 pgs).
Office Action issued in related U.S. Appl. No. 13/394,288, dated Aug. 18, 2014 (8 pgs).
Office Action issued in related U.S. Appl. No. 13/394,288, dated Jun. 12, 2014 (18 pgs).
Office Action issued in related U.S. Appl. No. 13/394,288, dated Mar. 18, 2014 (12 pgs).
Office Action issued in related U.S. Appl. No. 13/394,288, dated Oct. 16, 2014 (7 pgs).
Philippines Office Action issued in related application No. 1/2013/500025, dated Nov. 6, 2014 (2 pgs).
European Office Action issued in related application No. 13828204.1, dated Apr. 1, 2015 (3 pgs).
European Search Report issued in related application No. 12807127.1, dated Apr. 2, 2015 (10 pgs).
International Preliminary Report on Patentability, PCT/US13/050378, dated Feb. 19, 2015 (7 pgs).
International Search Report and Written Opinion, PCT/US14/63511, dated Feb. 11, 2015 (9 pgs).
Office Action issued in related U.S. Appl. No. 13/394,288, dated Mar. 23, 2015 (20 pgs).
Office Action issued in related U.S. Appl. No. 13/541,530, dated Feb. 17, 2015 (31 pgs).
Office Action issued in related U.S. Appl. No. 13/728,794, dated Mar. 24, 2015 (62 pgs).
Philippines Examination Report issued in related application No. 1/2013/500025, dated Apr. 8, 2015 (2 pgs).
Chinese Office Action (with translation) issued in application No. 201180043196.7, dated Apr. 3, 2015 (34 pgs).
Australian Examination Report No. 1 issued in related application No. 2011302303, dated Aug. 19, 2013 (4 pgs).
Lauterbach, "Smart Clothes Self-Powered by Body Heat," Avantex Symposium, 2002 (8 pgs).
Office Action issued in related U.S. Appl. No. 13/101,015, dated Nov. 4, 2013 (50 pgs).
Office Action issued in related U.S. Appl. No. 13/394,288, dated Nov. 14, 2013 (26 pgs).
*Skin Cooling Surfaces: Estimating the Importance of Limiting Skin Temperature*, By Charles Lachenbruch, Ostomy Wound Management. Feb. 2005 (8 pgs).
*The Thermoelectric Properties and Crystallography of Bi—Sb—Te—Se Thin Films Grown by Ion Beam Sputtering*, By H. Noro, K. Sato, and H. Kagechika, Journal of Applied Physics, 73 (3) Feb. 1, 1993.
*Efficient Switched Thermoelectric Refrigerators for Cold Storage Applications*, By Ghoshal and Guha, Journal of Electronic Materials, vol. 38, No. 7, 2009 (6 pgs).
*Vacuum Thermionic Refrigeration with a Semiconductor Heterojunction Structure*, by Y. Hishinuma, T.H. Geballe, B.Y. Moyzhes, Applied Physics Letters, vol. 81, No. 22, Nov. 25, 2002.
*Measurements of Cooling by Room Temperature Thermionic Emission Across a Nanometer Gap*, by Y. Hishinuma, T.H. Geballe, B.Y. Moyzhes, and T.W. Kenny, Journal of Applied Physics, vol. 94, No. 7, Oct. 1, 2003.
*Thermionic Refrigeration*, By G.D. Mahan, Journal of Applied Physics, vol. 76, No. 7, Oct. 1, 1994.
*Multilayer Thermionic Refrigerator*, By G.D. Mahan, J.A. Sofao and M. Bartkoiwak, Journal of Applied Physics, vol. 83, No. 9, May 1, 1998.
*Analysis of Nanonmeter Vacuum Gap Formation in Thermo-tunneling Devices*, by E T Enikov and T Makansi, *Nanotechnology Journal*, 2008.
*Refrigeration by Combined Tunneling and Thermionic Emission in a Vacuum: Use of Nanometer Scale Design*, by Y. Hishinuma, T.H. Geballe, B.Y. Moyzhes, Applied Physics Letters, vol. 78, No. 17, Apr. 23, 2001.
*Design and Characterization of Thin Film Microcoolers*, Chris LaBounty, Ali Shakouri, John E. Bowers, Journal of Applied Physics, vol. 89, No. 7, Apr. 1, 2001.
*Possible Cooling by Resonant Fowler-Nordheim Emission*, A.N. Korotkov and K.K. Likharev, Applied Physics Letters, vol. 75, No. 16, Aug. 23, 1999.
*Quantum, Cyclic, and Particle-Exchange Heat Engines*, Humphrey et al., Physica E29, 390-398, 2005.

(56) References Cited

OTHER PUBLICATIONS

*Micron-gap ThermoPhotoVoltaics (MTPV)*, by R. DiMatteo, P. Greiff, D. Seltzer, D. Meulenberg, E. Brown, E. Carlen, K. Kaiser, S. Finberg, H. Nguyen, J. Azarkevich, P. Baldasaro, J. Beausang, L. Danielson, M. Dashiell, D. DePoy, E. Ehsani, W. Topper, K. Rahner, R. Siergie, Thermophotovoltaic Generation of Electricity Sixth Conference, American Institute of Physics, 2004.
*Thermal and electrical properties of Czochralski grown GeSi single crystals*, by I. Yonenaga et al. Journal of Physics and Chemistry of Solids 2001.
*Thermotunneling Based on Cooling Systems for High Efficiency Buildings*, by Marco Aimi, Mehmet Arik, James Bray, Thomas Gorczyca, Darryl Michael, and Stan Weaver General Electric Global Research Center, DOE Report Identifier DE-FC26-04NT42324, 2007.
*Selective Epitaxial Growth of SiGe on a SOI Substrate by Using Ultra-High Vacuum Chemical Vapor Deposition*, by H. Choi, J. Bae, D. Soh, and S. Hong, Journal of the Korean Physical Society, vol. 48, No. 4, Apr. 2006, pp. 648-652.
*Strain relaxation of SiGe Islands on Compliant Oxide*, by H. Yin et al., Journal of Applied Physics, vol. 91, No. 12, Jun. 15, 2002.
*Complex Thermoelectric Materials*, By G. J. Snyder and E. S. Tober, Nature Materials, vol. 7 Feb. 2008.
*Substrate-Mediated Photo Induced Chemical Reactions on Ultrathin Metal Films*, V.P. Zhdanov, B. Kasemo, Department of Applied Physics, Apr. 19, 1999, Surface Science 432 (1999) L599-L603.
*Bismuth Telluride ($Bi_2Te_3$)Nanowires: Synthesis by Cyclic Electrodeposition/Stripping, Thinning by Electrooxidation, and Electrical Power Generation*, E. J. Menke et al, Langmuir 2006, 22, 10564-10574, Jun. 30, 2006.
*Electronic Properties of Bismuth Nanowires*, By Stephen B. Cronin et al., Dept of Physics, Electrical Engineering and Computer Science, Chemistry and Francis Bitter Magnet Laboratory, Massachusetts Institute of Technology, Cambridge, MA 02139.
*Electroplating of Conformal Electrodes for Vacuum Nanogap Tunnel Junction*, By Jangidze et al., Tbilisi State University, Chavchavadze Ave. 13, 0179, Georgia, Nov. 2008, pp. 1-11.
European Supplementary Search Report, issued Oct. 22, 2010, Appln No. 077814511.7-2208/2057659, PCT/US2007077042 (8 pgs).
International Search Report and Written Opinion issued in PCT/US2011/051227 dated Dec. 23, 2011 (11 pgs).
International Preliminary Report on Patentability, PCT/US07/07042, Mar. 12, 2009 (4 pgs).
International Search Report and Written Opinion issued in PCT/US07/77042, dated Sep. 5, 2008. (3 pgs).
International Search Report and Written Opinion, PCT/US07/60871, Jan. 22, 2007 (7 pgs).
International Search Report and Written Opinion, PCT/US09/69959, Mar. 15, 2010 (9 pgs).
Official Action dated Apr. 7, 2011 issued in related U.S. Appl. No. 12/302,782 (16 pgs).
Official Action issued in U.S. Appl. No. 12/376,254, dated Jun. 29, 2011 (23 pgs).
European Communication, issued May 27, 2011, Appln. No. 07 756 398.9-2208 (3 pgs).
European Communication, issued Jun. 1, 2011, Appln. No. 07 814 511.7-2208 (3 pgs).
International Search Report issued for PCT/US2012/045443, dated Oct. 1, 2012 (9 pgs).
McCarthy et al., "Enhancing Thermoelectric Energy Recovery via Modulations of Source Temperature for Cyclical Heat Loadings," Journal of Heat Transfer, Jun. 2007, vol. 129, pp. 749-755 (7 pgs).
PCT International Search Report and the Written Opinion issued for PCT/US2012/071838, dated Mar. 8, 2013 (10 pgs).
Mexican Office Action (w/o translation) issued in related application No. MX/a/2013/002569, dated Jun. 13, 2013 (3 pgs).
Co-pending U.S. Appl. No. 14/934,757, filed Nov. 6, 2015.
European Search Report and Written Opinion dated Oct. 12, 2010 for EP Application No. 07556398.9.
International Preliminary Report on Patentability dated Jul. 14, 2011 for PCT Application No. US2009/069959.
International Search Report and Written Opinion dated Apr. 15, 2009 for PCT Application No. US2007/060871.
International Search Report and Written Opinion dated Apr. 17, 2009 for PCT Application No. US2009/033660.
Notice of allowance dated Jun. 29, 2011 for U.S. Appl. No. 12/302,782.
Notice of allowance dated Sep. 7, 2012 for U.S. Appl. No. 12/367,965.
Notice of allowance dated Sep. 15, 2008 for U.S. Appl. No. 11/344,622.
Notice of allowance dated Nov. 21, 2011 for U.S. Appl. No. 12/376,254.
Office action dated Mar. 15, 2012 for U.S. Appl. No. 12/367,965.
Office action dated May 21, 2012 for U.S. Appl. No. 13/330,345.
Office action dated Nov. 13, 2015 for U.S. Appl. No. 13/394,288.
International search report and written opinion dated Jan. 21, 2016 for PCT/US2015/059598.
International search report and written opinion dated Jan. 29, 2014 for PCT/US2013/060549.
International search report and written opinion dated Apr. 22, 2016 for PCT/US2016/017603.
Office Action dated Feb. 1, 2016 for U.S. Appl. No. 13/541,530.
Office action dated Mar. 21, 2016 for U.S. Appl. No. 14/430,596.
European search report and opinion dated May 19, 2016 for Application No. 13828204.1.
International search report and written opinion dated Jun. 17, 2016 for PCT/US2016/019743.
Office Action dated Jun. 29, 2016 for U.S. Appl. No. 13/394,288.
Office action dated Aug. 10, 2016 for U.S. Appl. No. 14/430,596.
Notice of allowance dated Nov. 9, 2016 for U.S. Appl. No. 13/541,530.
Office action dated Oct. 14, 2016 for U.S. Appl. No. 14/530,360.
U.S. Appl. No. 13/101,015, filed May 4, 2011, Makansi et al.
U.S. Appl. No. 13/394,288, filed Mar. 5, 2012, Makansi et al.
U.S. Appl. No. 13/541,530, filed Jul. 3, 2012, Makansi et al.
U.S. Appl. No. 13/728,794, filed Dec. 27, 2012, Makansi.
U.S. Appl. No. 14/473,882, filed Aug. 29, 2014, Makansi et al.
U.S. Appl. No. 14/530,360, filed Oct. 31, 2014, Makansi et al.

* cited by examiner

Mobile device power mat: watts

Electric car charger: Kilowatts

MEDICAL, TOPPER, PET WIRELESS, AND AUTOMATED MANUFACTURING OF DISTRIBUTED THERMOELECTRIC HEATING AND COOLING

CROSS REFERENCE TO RELATED APPLICATION

This application claims priority from U.S. Provisional Application Ser. Nos. 61/680,405, files Aug. 7, 2012, and 61/716,671, filed Oct. 22, 2012, the contents of which are incorporated hereby reference.

BACKGROUND OF THE INVENTION

In our earlier U.S. patent applications Ser. No. 13/101,015 filed May 4, 2011 and Ser. No. 13/394,288 filed Mar. 5, 2012 and PCT Application Ser. Nos. PCT/US11/51227 filed Sep. 12, 2011 and PCT/US12/45443 filed Jul. 3, 2012, we describe a thermoelectric heating and cooling system comprising a connected string of thermoelectric elements woven or stuffed or layered into an insulating panel, which may be comprised of a soft material like foam, memory foam, bailing, or natural fabrics. A conductor material is expanded on either side of the panel to distribute heat on one side and cooling on the other. Such a material or surface upgraded with thermoelectric heating and cooling in this manner is called a distributed thermoelectric panel. In our earlier applications, integration of that insulating panel within mattresses, chairs, and blankets was also described. The end result was a relatively low cost, uniformly distributed addition of heating and cooling to bedding, seats, blankets, and other products.

SUMMARY OF THE INVENTION

The present invention provides various enhancements and improvements to heated and cooled products over the prior art, and also integration of thermoelectric heating and cooling panels into seat cushions, wheelchairs, hospital beds and bed tops, and pet beds. In addition, the present invention provides enhancements and improvements to the manufacturing of components of distributed thermoelectric panels for use in a variety of these and other products. Finally, the present invention provides improvements in the power delivery of distributed thermoelectric systems for increased mobility.

More particularly, in accordance with the present invention, we provide a distributed thermoelectric heating and cooling panel for use in hospital beds and wheelchairs that achieves low leakage current, compatibility with incontinence pads, and preservation of pressure distribution of underlying support surfaces. We provide a process for automated manufacturing of the components needed for distributed thermoelectric products utilizing both expandable stranded wires and flexible circuit configurations. We provide a heated and cooled seat topper that maintains the original and arbitrary shape of a seat cushion. Finally, we provide an elevated pet bed with heating and cooling for use by animals.

BRIEF DESCRIPTION OF THE DRAWINGS

Further features and advantages of the present invention will be seen from the following detailed description, taken in conjunction with the accompanying drawings, wherein like numerals depict like parts, and wherein FIG. 1 schematically illustrates a hospital bed with low leakage current.

DETAILED DESCRIPTION OF THE INVENTION

Figure 1:
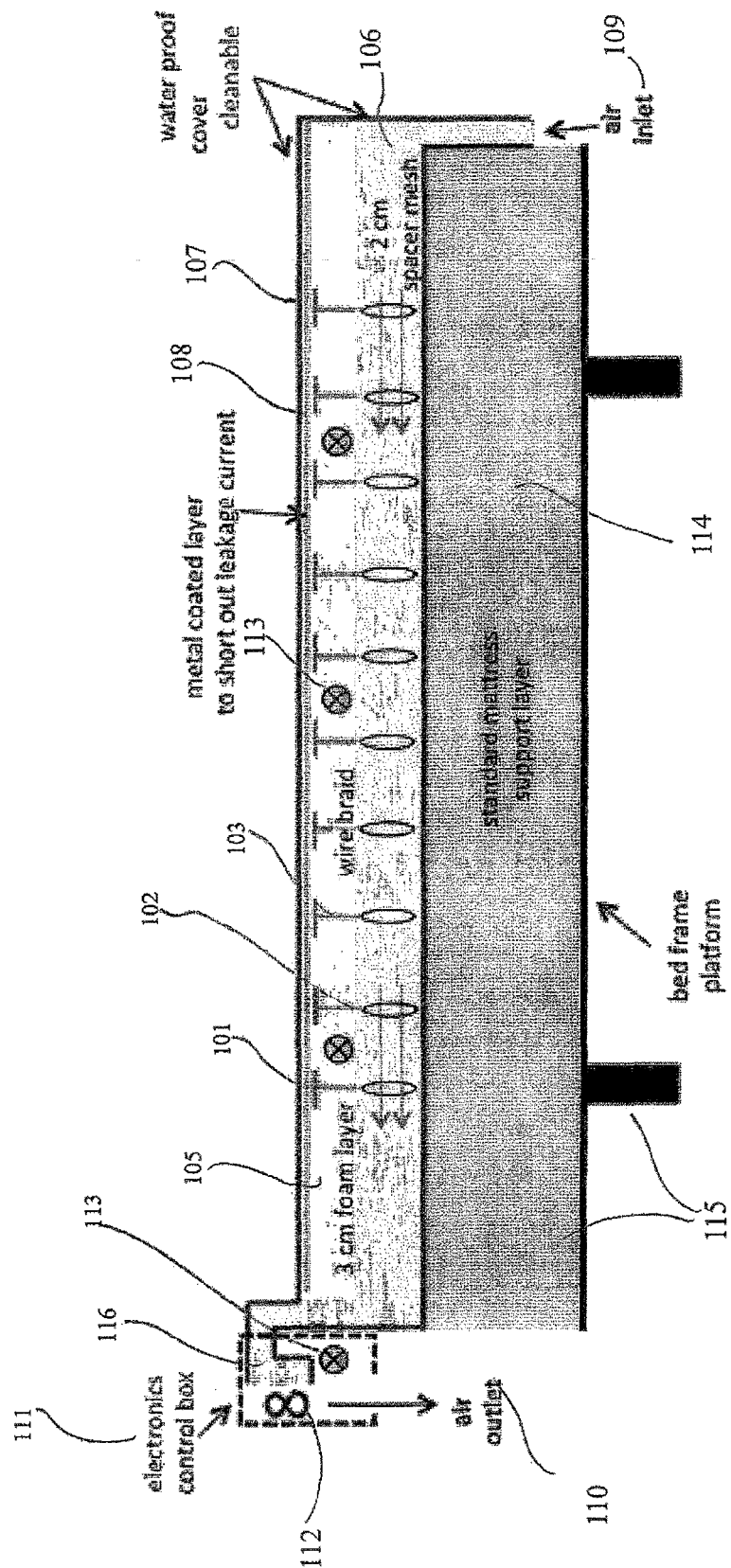

FIG. 1 shows a hospital bed that is comprised of a distributed thermoelectric string containing expanded link wires 101, thermoelectric elements 103, and expanded loop wires 102. An electrical current flowing through the thermoelectric elements 103 causes heat to be moved to or from the bed surface depending on the direction of the current. An insulating foam, in addition to the sting, are comprised in the thermoelectric panel 105, which is also the top layer of the bed surface. A spacer mesh layer 106 underneath provides porous channel for a fan 112 to move air from the inlet 109 to the outlet 110, such air flows over the loops 102 to remove or insert heat from or to, respectively, the environment. The thermoelectric panel and air-flow layer are situated on top of a standard hospital mattress 114 supported by a frame 115. A box 111 housing the electronics, controls, power supply and fan 112 connects to the spacer mesh through a slot 116. Temperature sensors or over-temperature switches 113 or other devices turn-off or facilitate turning off the power when unsafe conditions are reached may be located at various positions. These sensors may also be used to control the bed surface to a constant temperature for thermostatic control. Without limitation, the distribution of the thermoelectric elements 103 may have varying density, or be placed in zones with separate or common temperature controls to optimize the system for the patient. Because the requirement for very low leakage current that could be experienced by patients in a hospital under fault conditions, an electrically conducting sheet 108 is situated between the patient and the thermoelectric string. This conducting sheet will preferentially divert any electrical current and minimize the remaining current that can flow through the patient should the waterproof cover 107 be compromised. The conducting sheet is preferably a metallized fabric that stretches in all four lateral directions in order to conform to the contour of the patient's body while lying on the bed. This conducting sheet with these properties is available from Less EMF Inc.

and other suppliers. Without limitation, other conductive sheets could also serve this purpose such as screen, metal mesh, metallized mesh, and other materials containing metal or carbon.

Figure 2:
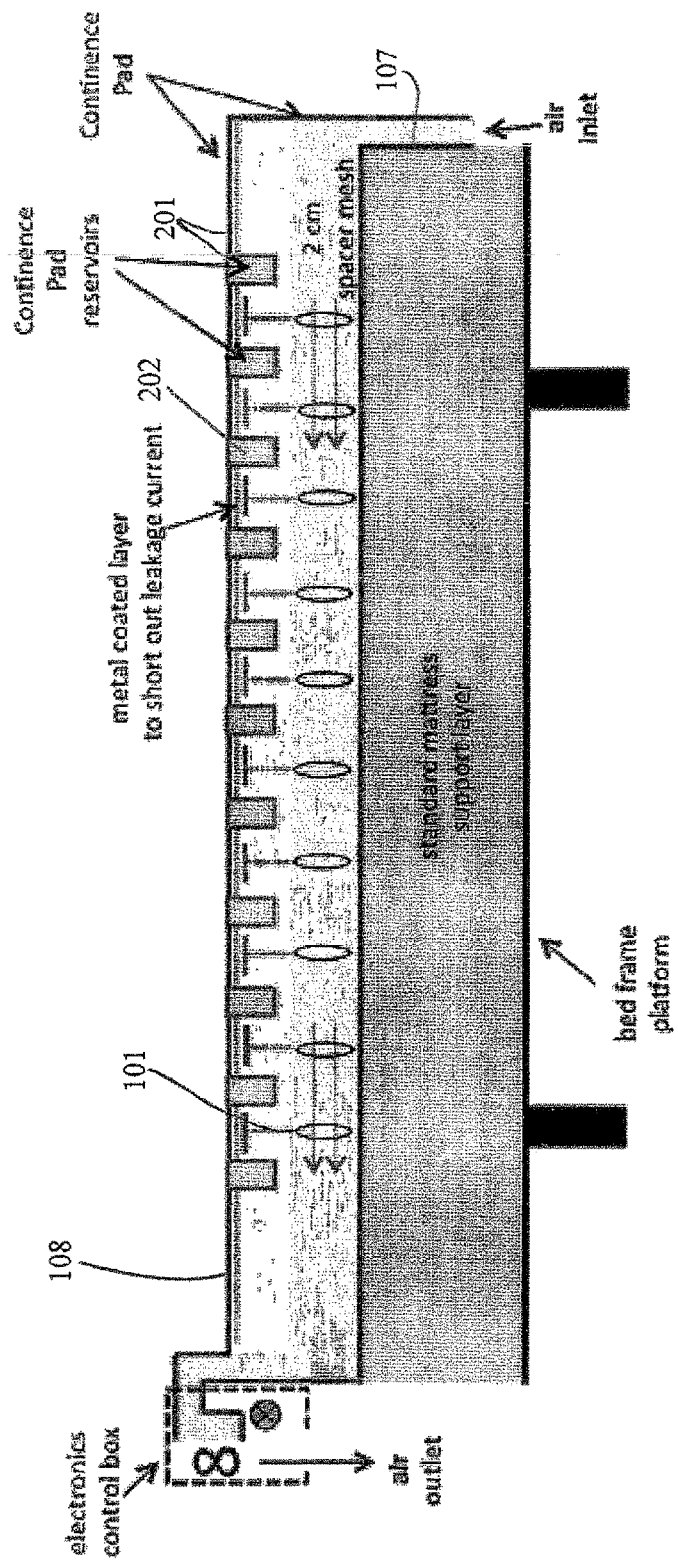
FIG. 2 schematically illustrates a hospital bed compatible with an incontinence pad.

FIG. 2 shows how the hospital bed of FIG. 1 is made compatible with an incontinence pad 201. In order to achieve the desired cooling of the skin to prevent pressure ulcers and perspiration, the layers separating the patient's body from the thermoelectric links 101 should be as thin as possible. Standard incontinence pads used in hospitals have thick absorption materials for bodily fluids. The incontinence pad 201 in FIG. 2 has thick areas 202 placed between the thermoelectric links. These thick areas act as fluid reservoirs and allow the portions of the incontinence pad 201 on top of the links 101 to be much thinner. Without limitation, these thick reservoir areas could be in an array or in parallel troughs located throughout the appropriate portion of the bed.

Many hospital beds have pressure redistribution characteristics to prevent or reduce the incidence of pressure ulcers. Some of these beds alternate pressure between two or more sets of supporting areas to prevent any one portion of the body from being subjected to high pressure for too long. Other beds have an array of mushroom shapes of foam in order to distribute pressure as much as possible. Still other beds have an array of air bladders in which air may flow from one bladder to the others to balance the pressure distribution. Cooling of the skin has been shown to further prevent or decrease the incidence of pressure ulcers, beyond the benefits of pressure-redistribution alone. Hence, a need exists to provide a cooling layer that retains the pressure distribution characteristics of the underlying surface.

Figure 3:
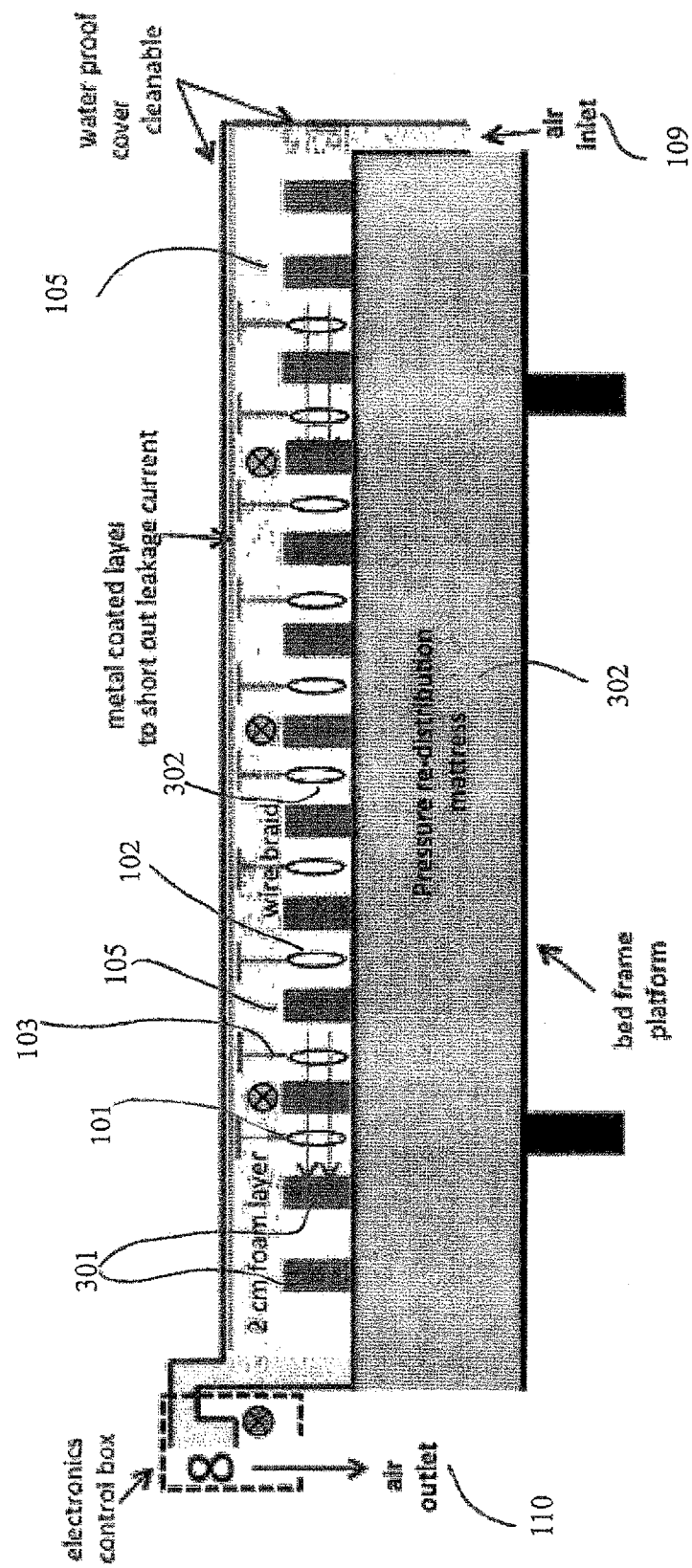
FIG. 3 schematically illustrates a hospital bed that maintains pressure redistribution.

FIG. 3 shows how the thermoelectric panel 105 is mounted on a matrix of spaced-apart support islands 301. These islands are able to displace vertically independent of each other. Even if the island 301 material is hard, their small size and independent movement allows for the pressure distribution to be retained. The spaces between the islands 302 permit airflow from the inlet 109 to the outlet 110. These islands may be comprised of spacer mesh, closed-cell foam, open cell foam, rubber, plastic, air balloons, fluid bladders, gels, or any other appropriate material. In the case of bladders, the fluid may be gel, oil, grease, wax, water, air, or other suitable liquid or gas. The thermoelectric panel 105 with the air flow layer comprising pillars 301 is placed on top of an existing pressure redistribution surface 302. Without limitation, the pressure redistribution surface 302 could be comprised of contoured foam, honeycomb gel, alternating pressure mechanisms, air bladder array, viscous fluid bag, or any other surface. These surfaces are available from Roho, Hill-Rom, Stryker, Sunrise, Pride Mobility and many others and apply to seating and bedding including wheelchairs, hospital beds, and operating tables.

Figure 4:
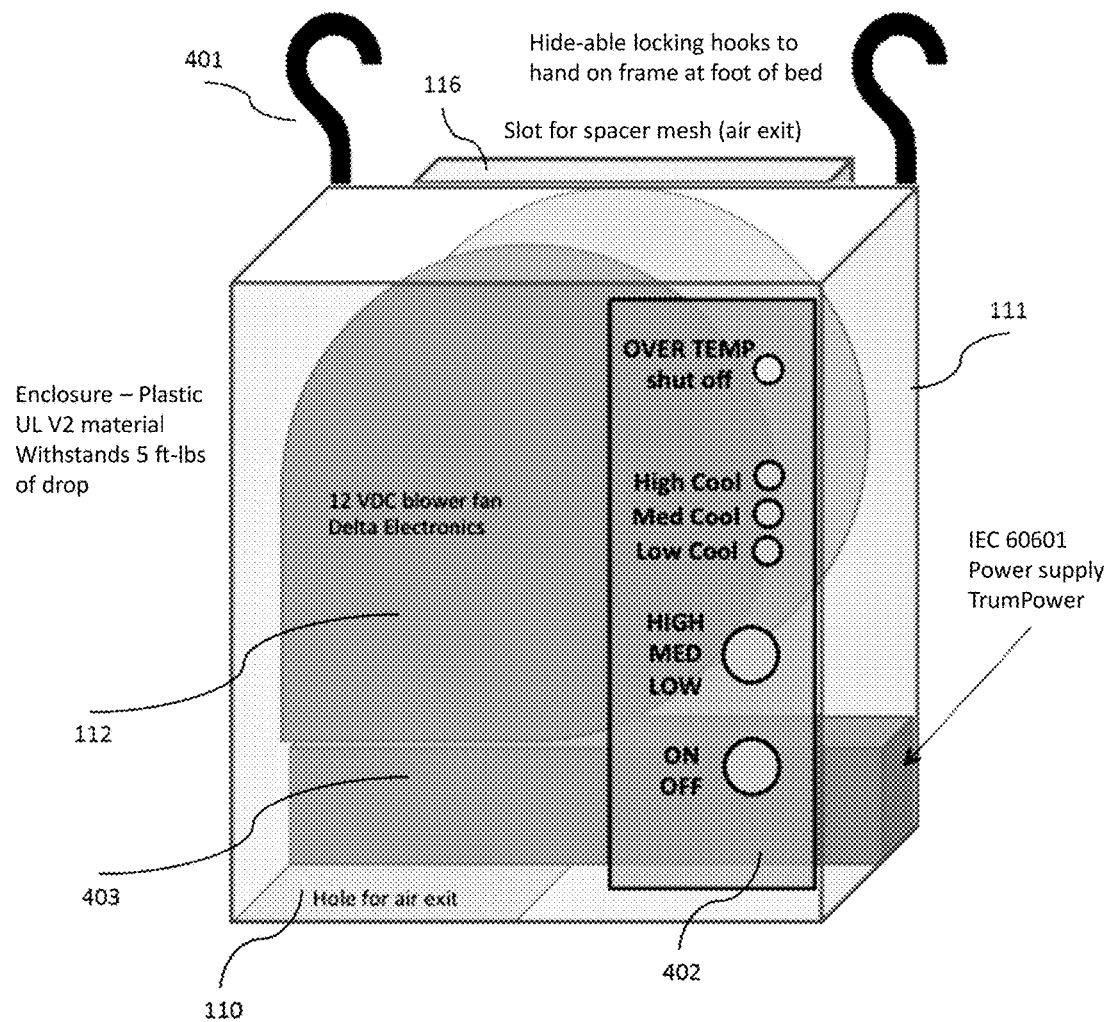
FIG. 4 illustrates a housing for a control electronics and fan for the thermoelectric panel of the hospital bed in FIGS. 1-3.

FIG. 4 shows a how the electromechanical components required for the operation of the thermoelectric panel may be housed in a single box 111. This box 111 has room for the power supply 403, the fan 112, and control electronics 402. The control electronics 402 provides for the functions of turning on and off 404, selecting the temperature or cooling power level 405, indicating the cooling intensity or temperature 406 with lights, and indicating fault conditions 407 such as over temperature or component failure. The box has a slot 116 for the spacer mesh or, without limitation, other channel for airflow and hooks 401 for hanging the box.

With the cooling power provided by each thermoelectric chip available today, typically hundreds of such chips are needed in a heated and cooled product. The thermoelectric string also needs to consist of hundreds of segments of expandable conductors such as stranded wire and hundreds of strain reliefs. Inserting each thermoelectric junction individually requires hundreds of insertions into the insulating and airflow layers. Hence, the need exists to automate the process for fabricating the thermoelectric string and for inserting the string into the insulator to make a thermoelectric panel.

Figure 5:
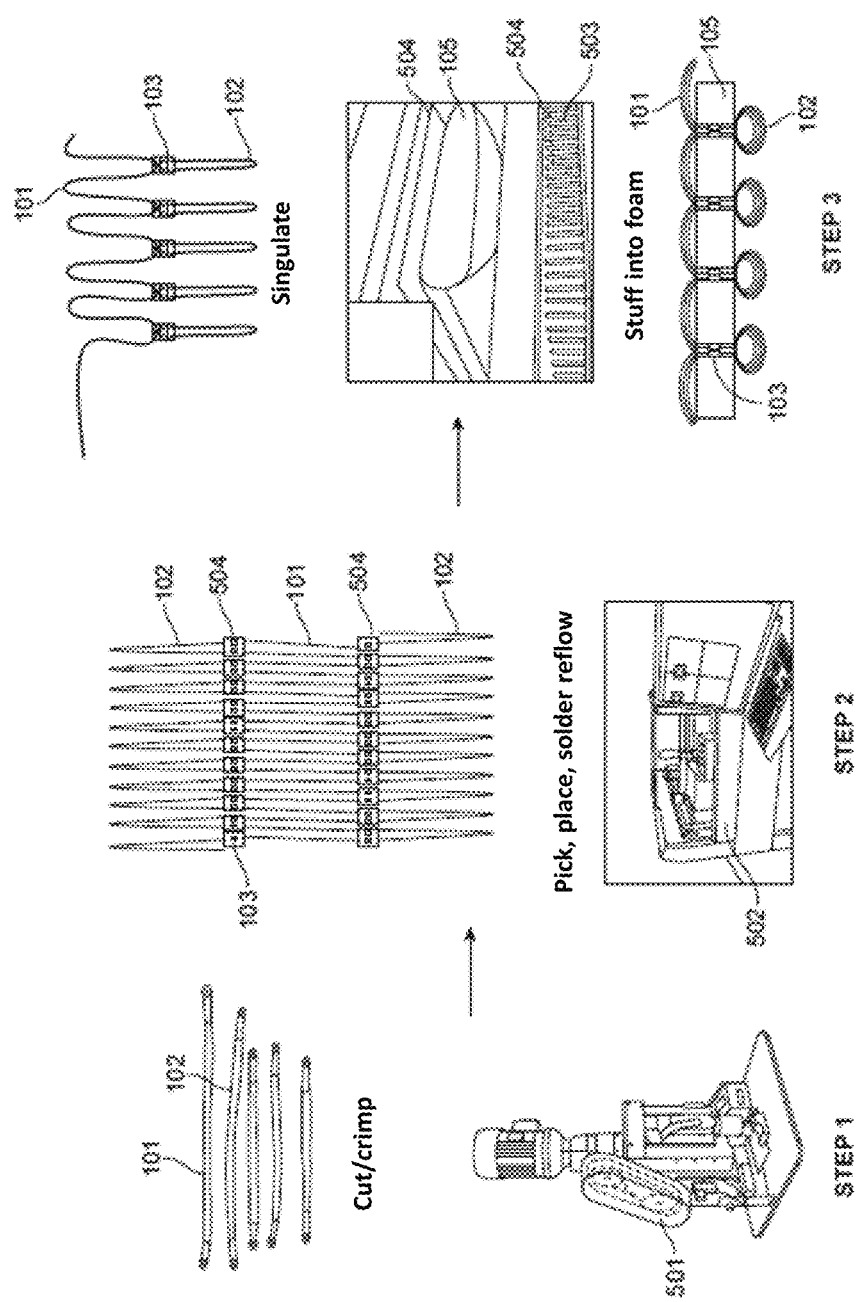
FIG. 5 schematically illustrates an automated process for manufacturing the thermoelectric string and panel wherein the string utilizes stranded wire.

FIG. 5 shows how the fabrication of the thermoelectric panel is achieved with three common automated machines that are readily available today. The first machine 501 cuts lengths of stranded wire and crimps a ferrule onto each end. The output of this machine is stranded wire segments with well-defined ends. Machines of this type are available from Schluniger and others.

The second machine 502 in FIG. 5 is one that makes circuit boards. This machine 502 has the ability to dispense glue, dispense solder, robotically place chips and other electronics components, and then flow the solder in an oven with a controlled temperature profile. To make a thermoelectric string, these functions are performed to generate strips 504 of thermoelectric junctions 103. The stranded wire links 101 are placed from strip 504 to another strip 504 and stranded wire loops 102 are placed on the outsides of the strips 504. Without limitation, groups of the links 101 and groups of the loops 102 may be placed manually or robotically in a carrier with comb-like slots to facilitate alignment of the ends of the links to the solder pads on the strips 504. The combination of links 101, loops 102, and strip 504 are moved through the reflow oven to melt and then harden the solder. After singulating the strips 504 into connected but individual thermoelectric junctions 103, a thermoelectric string is produced.

The third machine in FIG. 5 contains an array of sharp tubes 503 that is capable of puncturing many holes in the insulating layer simultaneously. This machine also has an array of holes 504 on top and bottom to guide the tubes and hold the insulating material in place, and a pneumatic or other system to generate the forces needed for complete puncture and insertion. Once the array of tubes has completely penetrated the insulating material, the loop 102 ends of the thermoelectric string are placed in the tubes either manually or robotically. Then, the array of tubes is removed in the opposite direction as it was inserted. A full thermoelectric panel is produced with all insertions accomplished simultaneously.

Figure 6:
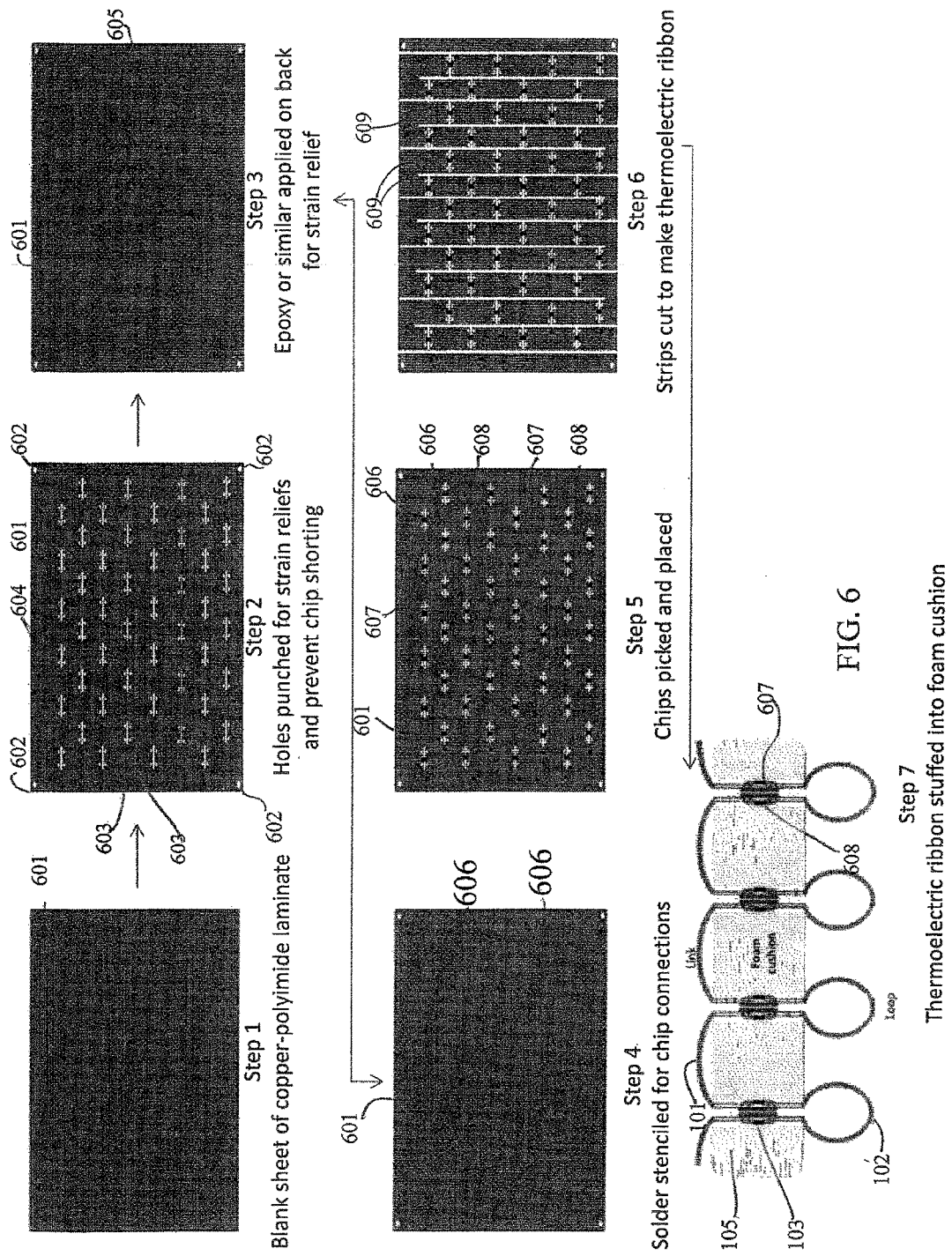
FIG. 6 schematically illustrates an automated process for manufacturing the thermoelectric string wherein the string utilizes flexible circuit material.

FIG. 6 shows another method for automating the production of the thermoelectric ribbon. In this case, a flexible circuit material 601 is used to replace both the stranded wires and the rigid strips of FIG. 5. One objective of the method shown in FIG. 6 is to not require etching of copper or patterning of the substrate. FIG. 6 Step 1 is a sheet of flexible circuit material 601 such as copper plated on a polyimide substrate. Without limitation, the flexible layer could be polyester, Mylar, or other suitable material. FIG. 6 Step 2 illustrates the flex material 601 after holes 602, 603, and 604 have been punched in a press or other suitable machine. Holes 602 on each corner are for registration and mounting of the board in a fixture, facilitating placement and alignment. Holes 603 remove the electrical connection between the ends of the chips that are placed in a later step. Holes 604 are for mounting and gripping of a strain relief that prevents large force disturbances from damaging the chips. FIG. 6 Step 3 shows a strain relief 605 made from epoxy or other hard or hardening material placed on the back of the flex circuit material. This strain relief 605 may be further formed into or inserted into the gripping holes 604 for additional strain-relieving strength. FIG. 6. Step 4 shows the placement of solder paste 605 on copper pads in preparation for placement of the thermoelectric chips in a later step. FIG. 6 Step 5 shows the placement of n-type thermoelectric chips 607 and p-type thermoelectric chips 608 in an alternating fashion on the flex circuit material and adjacent to the solder paste placements 606. The assembly of FIG. 6 Step 5 is then processed in a solder reflow oven in which the solder paste forms a hard eutectic bond with the ends of the chips and with the copper pads. Without limitation, the epoxy or other glue placed in Step 3 may be cured after Step 5 in the same reflow oven. FIG. 6 Step 6 shows a final cut 609 into strips that represents a two dimensional thermoelectric ribbon that is ready for insertion into 105 as indicated in FIG. 6 Step 7. The insertion process achieves a back-to-back placement of the n- and p- type thermoelectric chips 607 and 608. The thermoelectric panel of FIG. 6 Step 7 now resembles the distributed thermoelectric panel that can be used for a seat cushion, bed surface, refrigerator wall, beverage wrapper, or other product needing heating or cooling and/or the ability to switch from one to the other.

Figure 7:
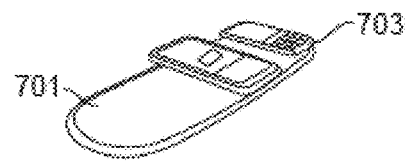
FIG. 7 schematically illustrates how power may be delivered wirelessly to a thermoelectric panel for increased mobility.
Figure 7:
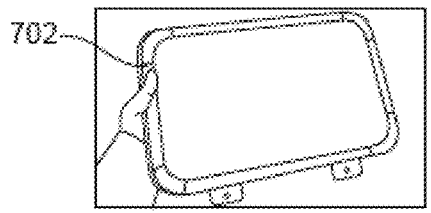
Figure 7:
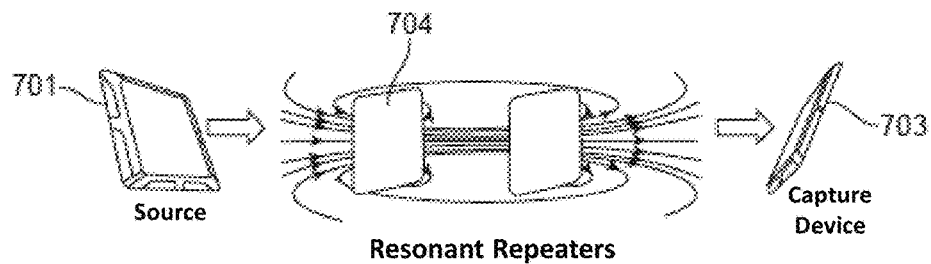
Figure 7:
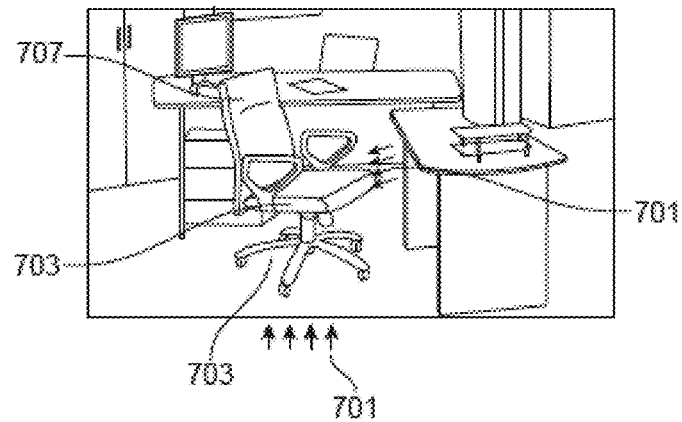

Distributed thermoelectric panels using this invention and others by the same inventors enable the addition of heating and cooling to any seating or sleeping surface. However, many such surfaces require mobility, such as office chairs on wheels. These products require delivery of power to the panel using wireless or other means that doe snot inhibit or restrict the mobility. FIG. 7 shows one configuration wherein wireless power is delivered to the thermoelectric panel inside of chair 707. Wireless power devices available from PowerMat, Qualcomm, WiTricity and others deliver wireless power to mobile devices such as cellphones and automobiles. These wireless power transmitters 701 and 702 deliver power to a corresponding wireless receiver inside of a mobile device 703. The power level required for a thermoelectric panel is greater than 701 for cellphones, but less than 702 for charging batteries in an automobile. Hence, it is expected that either device could be scaled as needed to power an office chair 707, for example.

Figure 8:
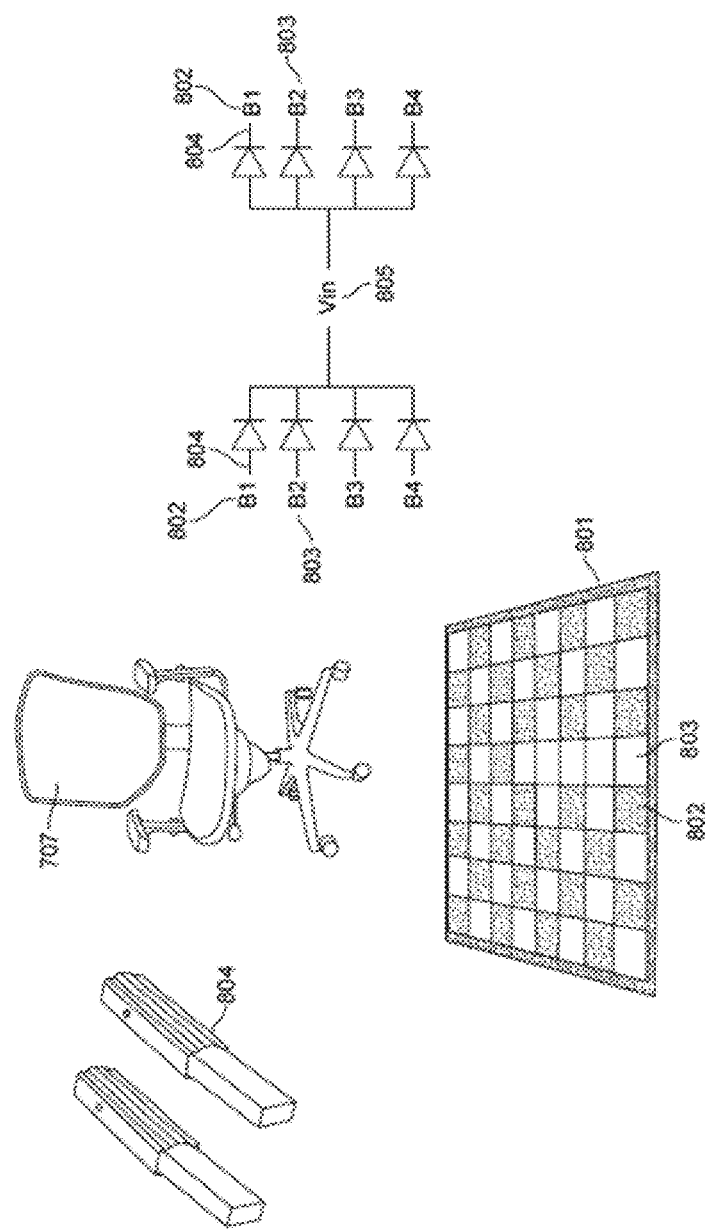
FIG. 8 schematically illustrates how power may be delivered by movable contacts to a thermoelectric panel for increased mobility.

FIG. 8 shows another embodiment to permit mobility of products containing thermoelectric panels. In this case, conductive brushes 804 slide in contact with an underlying mat 801 containing alternating conducting electrodes 802 for a power supply voltage and 803 for ground. Without limitation, a plurality of brushes 804 are mounted on the ends of the spider 806 or on the wheels of any mobile device containing a distributed thermoelectric panel. As long as at least one of the brushes 804 is in contact with the power supply voltage electrodes 802 and at least one other brush is in contact with ground electrodes 803, power voltage yin 805 may be delivered to the thermoelectric panel in the chair using the diode array circuit in FIG. 8. All of the electrodes 802 and 803 are electrically connected to both ends of the diode array 802, and the rectification function of the diodes insures that power Vin 805 flows from the power supply source to ground.

Figure 9A:
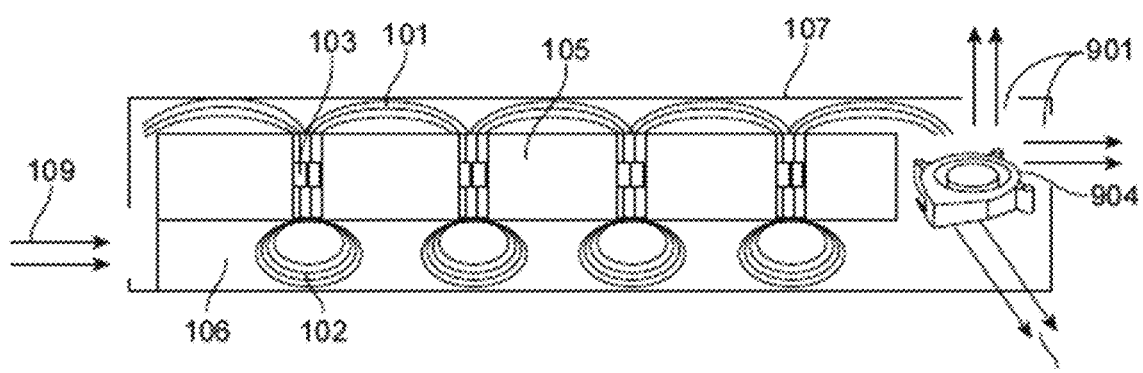
FIGS. 9A and 9B schematically illustrate how the thermoelectric panel may be integrated into a seat cushion or bed top.
Figure 9B:
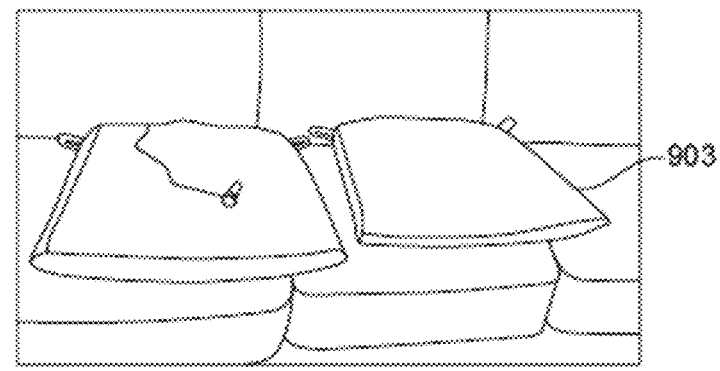

One application for heated and cooled seating is a seat or back cushion that is sized comparably to such cushions readily available and powered using a cord or a battery. Such a cushion is illustrated in FIGS. 9A and 9B. The air inlet 109 is in the front for a seat bottom cushion or at the top for a seat back cushion. Without limitation, the air inlet could be partially or wholly the distributed porosity of the cover 107. The thermoelectric panel 105 is placed on top of a spacer mesh airflow layer 102. Blower fan 904 is located in the back of the seat bottom cushion or the lower end of a seat back cushion. The air is pulled from the inlet 109 by the blower fan and exhausted to air outlet 110. Depending on the arrangement of the seat cushion, the preferred direction of the exhaust 110 might be blocked, so alternative outlets 901 may be added which have different directions of airflow. A cover 107 separates the seat surface from the wires 101 of the thermoelectric panel. For purposes of comfort and performance, the cover 107 may comprise soft but thermally conductive material such as carbon fibers, glycerin, gel, or unexpanded polyurethane. The entire heating and cooling system may be contained within the size and shape of a conventional seat cushion.

Figure 10:
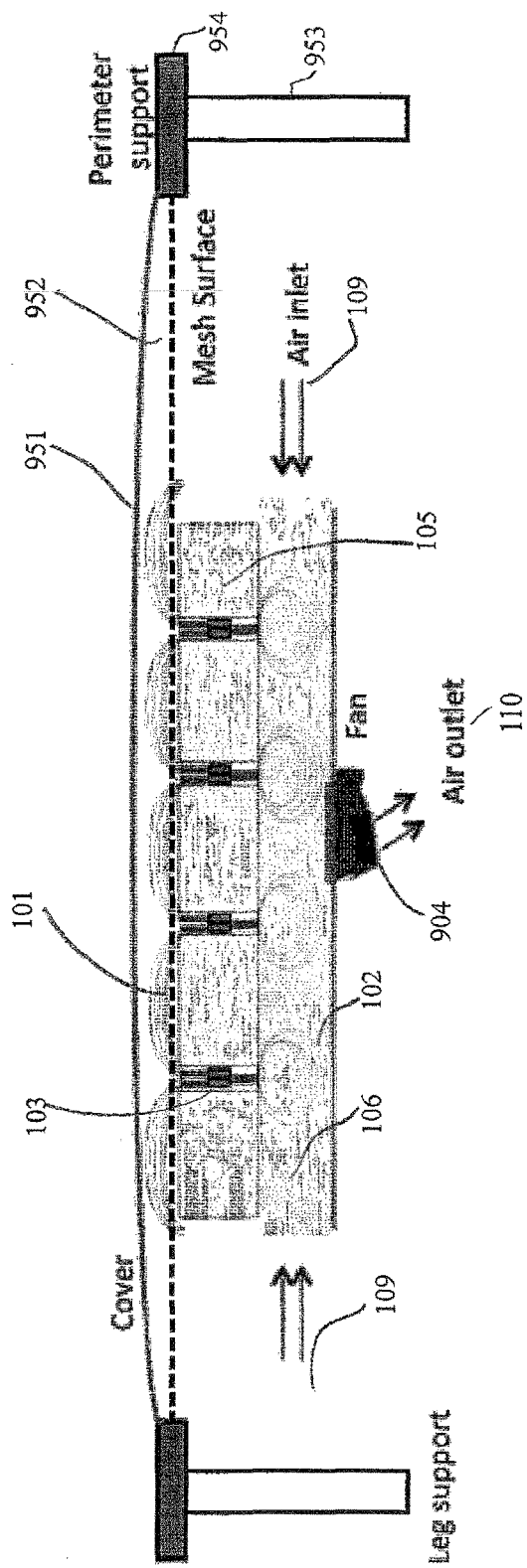
FIG. 10 schematically illustrates how the thermoelectric panel may be integrated into an elevated pet bed for animal use.

FIG. 10 shows a heated and cooled bed for a pet or other animal for comfort indoors or outdoors. Many existing pet beds are elevated to provide ventilation from underneath. In FIG. 10, the elevated support layer 952 and frame 953 and 954 are retained. The thermoelectric wires 101 are brought through to the top of the support layer 952 or are in good contact from underneath. The air inlet 109 may be some of or all of the perimeter of the spacer-mesh 106 with fan 904 pulling the air from these inlets to the outlet 110. Cover 951 separates the pet from the wires 101 of the thermoelectric panel.

Various changes may be made without departure from the spirit and scope of the present invention.

We claim:

1. A thermoelectric device comprising a panel formed of a substrate material that is electrically insulating, and having a plurality of thermoelectric elements comprising compacted conductors located at least in part inside the substrate material and expanded conductors located at least in part outside the substrate material, wherein the panel is covered by a conducting sheet that diverts leakage current, wherein the panel is mounted on top of a bed or bed frame, seat or seat frame, hospital bed or hospital bed frame, wheelchair cushion or wheelchair frame, or operating table.

2. The device of claim 1, further including a top pad with reservoirs placed between the expanded conductors for accumulation of bodily fluids.

3. The device of claim 1, further including an airflow layer comprising a matrix of support pillars that are movable independently in a vertical direction to redistribute pressure.

4. The device of claim 3, wherein the support pillars are comprised of a plastic, a spacer mesh, a closed cell foam, an open cell foam, or a balloon containing fluid.

5. The device of claim 4, wherein the fluid comprises air, water, a gel, a paste, an oil, or a wax.

6. The device of claim 1, wherein the panel is placed on top of or integrated into an alternating pressure surface, pressure redistributing surface, operating table, or other therapeutic surface.

7. A method for forming thermoelectric device comprising a panel formed of substrate material that is electrically insulating, and having a plurality of thermoelectric elements comprising compacted conductors located at least in part inside the substrate material and expanded conductors located at least in part outside the substrate material, wherein the panel is covered by a conducting sheet that diverts leakage current, and wherein the panel is produced in an automated fashion by machines that perform one or more of the following operations:

wire cutting, wire crimping, tinning, picking and placing of thermoelectric elements, dispensing or stenciling of solder or solder paste, solder reflow, singulation, and puncture of the insulating layer with an array of hollow needles.

8. A method for forming a thermoelectric device comprising a panel formed of substrate material that is electrically insulating, and having a plurality of thermoelectric elements comprising compacted conductors located at least in part inside the substrate material and expanded conductors located at least in part outside the substrate material, wherein the panel is covered by a conducting sheet that diverts leakage current, and wherein the panel is produced in an automated fashion by machines that perform one or more of the following operations: flex circuit patterning by etching or punching, robotic picking and placing of elements, dispensing of solder or solder paste, solder reflow, and puncture of the insulating layer with hollow needles.

9. The method of claim 7, wherein the elements are first placed in reels of tape to facilitate robotic picking, and wherein the solder or solder paste is comprised of pure tin, tin, bismuth, antimony, or copper or an alloy thereof.

10. The method of claim 8, wherein the elements are first placed in reels of tape to facilitate robotic picking, and wherein the solder or solder paste is comprised of pure tin, tin, bismuth, antimony, or copper or an alloy thereof.

11. A thermoelectric device comprising a panel formed of a substrate material that is electrically insulating, and having a plurality of thermoelectric elements comprising compacted conductors located at least in part inside the substrate material and expanded conductors located at least in part outside the substrate material, wherein the panel is covered by a conducting sheet that diverts leakage current, and further comprising a wireless power transmitter and receiver for powering the device.

12. The device of claim 11, wherein the wireless power transmitter and receiver employ resonant magnetic or electromagnetic waves.

13. A thermoelectric device comprising a panel formed of a substrate material that is electrically insulating, and having a plurality of thermoelectric elements comprising compacted conductors located at least in part inside the substrate material and expanded conductors located at least in part outside the substrate material, wherein the panel is covered by a conducting sheet that diverts leakage current, and further comprising a movable conducting brush in contact with a stationary array of electrodes connected to a power source for powering the device.

14. The device of claim 13, further comprising an array of stationary electrodes each connected to power supply or ground voltages and adapted to contact with the movable conducting brushes.

15. The device of claim 13, further including diodes or rectifiers for selecting which contacted electrodes provide power supply voltage and ground voltage to the device.

16. The device of claim 13, wherein the conducting brush is mounted on or near wheels of a rolling chair, rolling bed, or other rolling seat or bed.

17. A thermoelectric system comprising a cushion comprising a thermoelectric panel mounted on top of an airflow layer comprising a porous cover combined with a blower fan, wherein air from the blower fan is sourced from one or more sides or edges of the porous cover and exits in multiple directions.

18. The thermoelectric system of claim 17, wherein the cushion is positioned as a seat bottom or seat back.

19. The thermoelectric system of claim 17, further comprising a battery.

20. The thermoelectric system of claim 17, wherein the cushion is mounted underneath an elevated bed.

21. The thermoelectric system of claim 17, wherein the thermoelectric panel includes expanded conductors positioned along a surface of the cushion and compacted conductors routed through holes in the surface.

22. A system comprising a plurality of panels that are arranged to be selectively turned on and off to provide more or less cooling or heating in response to local pressure, local temperature, local body sensitivity or a combination thereof, wherein an individual panel of the plurality of panels is formed of a substrate material that is electrically insulating, and includes a plurality of thermoelectric elements comprising compacted conductors located at least in part inside the substrate material and expanded conductors located at least in part outside the substrate material, wherein the individual panel is covered by a conducting sheet that diverts leakage current.

23. The thermoelectric system of claim 17, further comprising a cover with thermally conductive materials selected from the group consisting of carbon fiber, gel, glycerin, metal particles and polyurethane.

24. The device of claim 22, wherein the substrate material is thermally insulating.

25. The device of claim 1, wherein the conducting sheet comprises a screen, a mesh, or a fabric.

26. The device of claim 25, wherein the screen, mesh, or fabric is metallized or comprised of metal or carbon.

27. The device of claim 1 wherein the substrate material or the conducting sheet is stretchable in one or more dimensions.

* * * * *